United States Patent [19]
Harris et al.

[11] Patent Number: 6,150,671
[45] Date of Patent: *Nov. 21, 2000

[54] SEMICONDUCTOR DEVICE HAVING HIGH CHANNEL MOBILITY AND A HIGH BREAKDOWN VOLTAGE FOR HIGH POWER APPLICATIONS

[75] Inventors: Christopher Harris, Sollentuna; Ulf Gustafsson, Linköping; Mietek Bakowski, Skultuna, all of Sweden

[73] Assignee: ABB Research Ltd., Zurich, Switzerland

[ * ] Notice: This patent issued on a continued prosecution application filed under 37 CFR 1.53(d), and is subject to the twenty year patent term provisions of 35 U.S.C. 154(a)(2).

[21] Appl. No.: 08/636,943

[22] Filed: Apr. 24, 1996

[51] Int. Cl.$^7$ .................................................. H01L 29/22
[52] U.S. Cl. .............................. 257/78; 257/213; 257/57; 257/58; 257/59; 257/291; 257/294; 257/326; 257/347; 257/360; 257/363; 257/401; 257/153; 257/341; 257/147; 438/268; 438/546; 438/931; 438/272; 438/274; 438/545
[58] Field of Search .............................. 257/78, 213, 57, 257/58, 59, 291, 294, 326, 347, 360, 363, 401, 77, 329, 330, 342, 153, 341, 147; 438/268, 546, 931, 272, 274, 545

[56] References Cited

U.S. PATENT DOCUMENTS

| | | |
|---|---|---|
| 4,130,890 | 12/1978 | Adam .......................................... 257/78 |
| 4,568,958 | 2/1986 | Baliga ......................................... 257/77 |
| 4,760,432 | 7/1988 | Stoisiek et al. ........................... 257/330 |
| 5,322,802 | 6/1994 | Baliga et al. .............................. 437/22 |
| 5,384,270 | 1/1995 | Ueno ......................................... 437/40 |
| 5,397,717 | 3/1995 | Davis et al. ............................... 437/40 |
| 5,466,348 | 11/1995 | Holm-Kennedy .................... 204/153.1 |
| 5,773,849 | 6/1998 | Harris et al. ............................ 257/329 |
| 5,831,292 | 11/1998 | Harris et al. ............................ 257/139 |
| 5,849,620 | 12/1998 | Harris et al. ............................ 438/273 |

*Primary Examiner*—Carl Whitehead, Jr.
*Assistant Examiner*—Matthew E. Warren
*Attorney, Agent, or Firm*—Pollock, Vande Sande & Amernick, R.L.L.P.

[57] ABSTRACT

A transistor of SiC having a drain and a highly doped substrate layer is formed on the drain. A highly n type buffer layer may optionally be formed on the substrate layer. A low doped n-type drift layer, a p-type base layer, a high doped n-type source region layer and a source are formed on the substrate layer. An insulating layer with a gate electrode is arranged on top of the base layer and extends substantially laterally from at least the source region layer to a n-type layer. When a voltage is applied to the gate electrode, a conducting inversion channel is formed extending substantially laterally in the base layer at an interface of the p-type base layer and the insulating layer. The p-type base layer is low doped in a region next to the interface to the insulating layer at which the inversion channel is formed and highly doped in a region thereunder next to the drift layer.

7 Claims, 3 Drawing Sheets

SEMICONDUCTOR DEVICE HAVING HIGH CHANNEL MOBILITY AND A HIGH BREAKDOWN VOLTAGE FOR HIGH POWER APPLICATIONS

TECHNICAL FIELD

The present invention relates to a transistor of SiC having an insulated gate and being of either a) a MISFET or b) an IGBT. The transistor comprises superimposed in the order mentioned a drain, a highly doped substrate layer being for a) of n-type and for b) of p-type, for b) on top thereof one of c) a highly doped n-type buffer layer and d) no such layer, a low doped n-type drift layer, a p-type base layer, a highly doped n-type source region layer and a source. The transistor further comprises an insulating layer with a gate electrode thereon arranged on top of the base layer and extending substantially laterally from at least the source region to a n-type layer being of either e) the drift layer or f) an additional n-type layer connected to the drift layer, for, upon applying a voltage to the gate electrode, forming a conducting inversion channel extending substantially laterally in the base layer at the interface to the insulating layer for electron transport from the source to the drain. This invention also relates to a method for producing such a transistor.

BACKGROUND OF THE INVENTION

Transistors of SiC may especially be used as switching devices in power applications since the cable turned on and off very rapidly. Such transistors made of SiC are particularly well suited for high power applications, since such applications make it possible to benefit from the superior properties of SiC in comparison with especially Si, namely the capability of SiC to function well under extreme conditions. SiC has a high thermal stability due to a large bandgap energy, such that devices fabricated from the material are able to operate at high temperatures, namely up to 1000° K. Furthermore, Sic has a high thermal conductivity so that SiC devices may be arranged at a high density. SiC also has a more than five times higher breakdown field than Si, so that it is well suited as a material in high power devices operating under conditions where high voltages may occur in the blocking state of a device.

An advantage of this type of MISFET and IGBT having an inversion channel extending substantially laterally is that the charge carrier mobility in such an inversion channel is much higher than in the devices having a vertical inversion channel along a trench. This is because the trap density at the interface between the base layer and the insulating layer will be much lower with this location of the surface channel, since the surface of the base layer may be formed by epitaxial growth, whereas the vertical trench wall of a device with a vertical channel has to be formed by etching or the like giving rise to a higher concentration of traps. Another advantage of this type of device structure is the absence of reliability problems connected with the high electric field occuring at the trench corner of a transistor having such a trench.

MISFET is to be interpreted broadly and shall comprise every type of field effect transistor having an insulated gate, and accordingly also MOSFETs.

A transistor according to the introduction in the form of a MOSFET is known through U.S. Pat. No. 5,397,717. However, this transistor does not make it possible to fully benefit from the excellent property of SiC to withstand high reverse voltages in the blocking state thereof, so that it is not be suited for use in high power applications. The reason for this is that the base layer of p-type has to be low doped to keep the threshold voltage, which has to be applied on the gate for creating the inversion channel, comparatively low and by that obtain a high carrier mobility in the channel. However this low doping of the base layer will result in a depletion thereof already at a low reverse voltage, and thus this device cannot withstand high reverse voltages, which occur in high power applications.

SUMMARY OF THE INVENTION

The object of the present invention is to provide a transistor of the type defined in the introduction, through which the problem of the prior art transistor described above is solved to a large extent making it well suited for high power applications.

This object is, in accordance with the invention, obtained by making the p-type base layer low doped in a region next to the interface with the insulating layer at which the inversion channel is obtainable, and highly doped in a region thereunder next to the drift layer.

By doping different regions of the base layer differently way a high channel mobility thanks to a low threshold voltage may be combined with a high breakdown voltage in the blocking state of the transistor. The region of low doping next to the interface to the insulating layer results in a low threshold voltage, i.e. a low voltage necessary to apply to the gate for creating the inversion channel and thereby a high charge mobility in the channel. The highly doped region thereunder next to the pn-junction to the drift layer will make it possible to apply high reverse voltages to the transistor without depleting the base layer and causing a breakdown of the device. Thus, this transistor will be well suited for high power applications.

According to a preferred embodiment of the invention the p-type base layer is divided into two sub-layers, a highly doped lower first base sub-layer and a low doped upper second base sub-layer on top thereof. The combination of a low threshold voltage, which means a high channel mobility, and a high breakdown voltage may in this way be advantageously obtained by making the base layer of two differently strong doped layers.

According to another preferred embodiment of the invention the transistor comprises an additional n-type layer arranged laterally of the base layer on the base layer at a lateral distance from the source region layer. The additional n-type layer extends to the drift layer to conduct electrons moving in the conducting inversion channel from the source region layer to the drift layer. The additional n-type layer is highly doped. In this way a low resistance of the transistor in the on-state may be achieved at the same time as the blocking capacity thereof will be high when reverse biased.

According to a further preferred embodiment of the invention the transistor comprises an additional highly doped p-type layer on top of the base layer and located laterally at the opposite side of the source region layer with respect to the interface for forming the conducting inversion channel, and this additional p-type layer is connected to the source. Accordingly, a good contact from the source to the p-base may be obtained. Furthermore, if the transistor is an IGBT this additional layer will collect the holes injected into the drift layer from the substrate layer as a consequence of the electron current flowing through the inversion channel and towards the drain. These holes are moving towards the source for recombining with electrons from the source.

A further object of the invention is to provide a method for producing a transistor of SiC having an insulated gate and being either of a) a MISFET or b) an IGBT, for which the drawback of the prior art transistor of this type discussed above is considerably reduced.

Such a method comprises according to the invention the steps of:

1) epitaxially growing on top of each other the following semiconductor layers of SiC: a highly doped substrate layer being for a) n-type and for b) p-type, for b) on top thereof either of c) a highly doped n-type buffer layer or d) no such layer, and a low doped n-type drift layer,
2) implanting p-type dopants into a surface layer of the drift layer for forming a highly doped p-type first base sub-layer,
3) epitaxially growing a low doped p-type second base sub-layer on top of the first base sub-layer,
4) implanting n-type dopants into a surface layer of the second base sub-layer to form a highly doped n-type source region layer,
5) etching away the second base sub-layer at a lateral distance from the source region layer to form a wall extending to the drift layer,
6) implanting n-type dopants into the second base sub-layer at a lateral distance from the source region layer and in connection with the wall and into the wall to form an additional n-type layer extending from the surface of the second base sub-layer to the drift layer,
7) applying an insulating layer with a gate electrode thereon on the second base sub-layer at least from the source region layer to the additional n-type layer and a source on the source region layer, the steps 4) and 5) being carried out in either one of the following orders: a) 4), and then 5) and b) 5) and then 4).

In this way a transistor with a lateral inversion channel well suited for high power applications thanks to a low threshold voltage in combination with a high breakdown voltage may be obtained in an advantageous way. The key to obtaining such a transistor is the combination of implanting of p-type dopants into a surface layer of the epitaxially grown drift layer for forming a highly doped p-type first base sub-layer with an epitaxial regrowth of a low doped p-type second base sub-layer on top of the first base sub-layer. Use of this regrowth technique allows to employ the preferred implantation technique for obtaining the lower highly doped p-type base sub-layer without causing any damages in the upper base sub-layer, so that this may have a high quality at the interface with the insulating layer. Accordingly, this method enables the production of a transistor of this type of SiC, in which the diffusitivity of dopants is remarkably reduced in comparison to especially Si. The dopants implanted will automatically be made electrically active thanks to the high temperature used for the epitaxial growth following upon the implantation step.

Another method through which the object of the present invention may be obtained comprises the steps of:

1) epitaxially growing on top of each other the following semiconductor layers of SiC: a highly doped substrate layer being for a) n-type and for b) p-type, for b) on top thereof either of c) a highly doped n-type buffer layer or d) no such layer, a low doped n-type drift layer, a highly doped p-type first base sub-layer and a low doped p-type second base sub-layer,
2) etching through the two base sub-layers to the drift layer for forming a wall on the two base sub-layers,
3) epitaxially growing an additional n-type layer on the wall and onto the drift layer laterally to the base sub-layers so that this additional n-type layer will have an upper surface next to the second base sub-layer at substantially the same level as the upper surface of the second base sub-layer,
4) implanting n-type dopants into a surface layer of the second base sub-layer for forming a highly doped n-type source region layer separated laterally from the additional n-type layer,
5) applying an insulating layer with a gate electrode thereon on the second base sub-layer at least from the source region layer to the additional n-type layer and a source on the source region layer, the step 4) being carried out either a) after steps 2) and 3), or b) before steps 2) and 3) or c) after step 2) but before step 3).

By using this method a transistor of SiC having an insulated gate and being a MISFET or an IGBT with a lateral inversion channel and the same preferred characteristics as that previously mentioned may be produced. An advantage of this method with respect to the method previously described is that the thickness of the highly doped first base sub-layer may be chosen arbitrarily as a function of the voltage which the particular transistor has to block when reverse biased.

Further advantages and preferred features of the invention will appear from the description and the other claims.

BRIEF DESCRIPTION OF THE DRAWINGS

With reference to the appended drawings, below follows a specific description of preferred embodiments of the invention cited as examples.

In the drawings:

FIGS. 8–11 are schematic cross-section views illustrating different steps of a method for producing an IGBT shown in FIG. 3 and according to a third preferred embodiment of the invention.

DETAILED DESCRIPTION OF PREFERRED EMBODIMENT (S)

Figure 1:
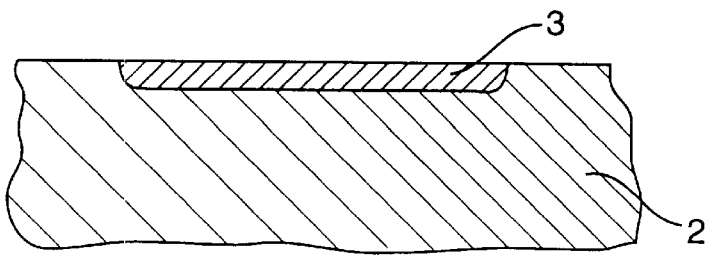
FIGS. 1–4 are schematic cross-section views illustrating different steps of a method for producing a MISFET shown in FIG. 4 and according to a first preferred embodiment of the invention.
Figure 2:
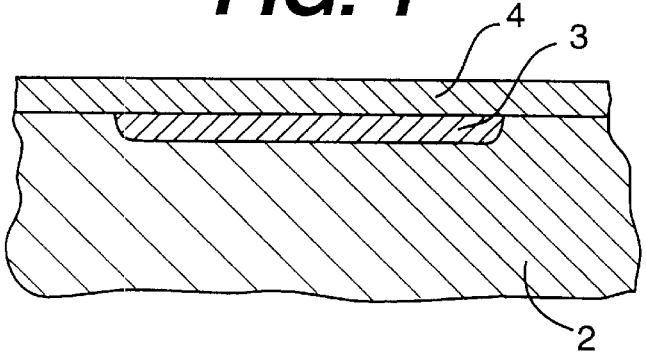
Figure 3:
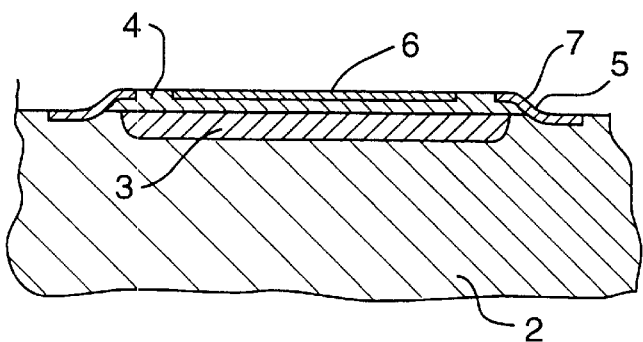
Figure 4:
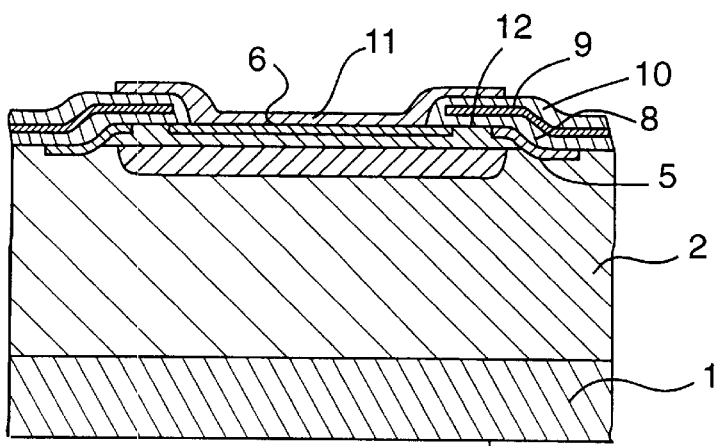
Figure 5:
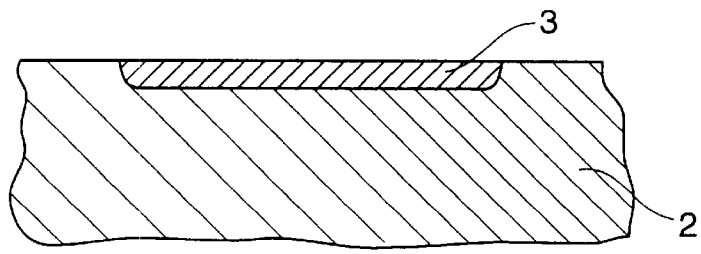
FIGS. 5–8 are views corresponding to FIGS. 1–4 illustrating different steps of a method for producing an IGBT shown in FIG. 4 and according to a second preferred embodiment of the invention.
Figure 6:
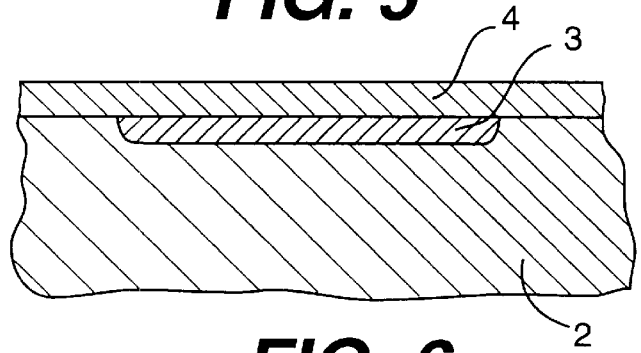
Figure 7:
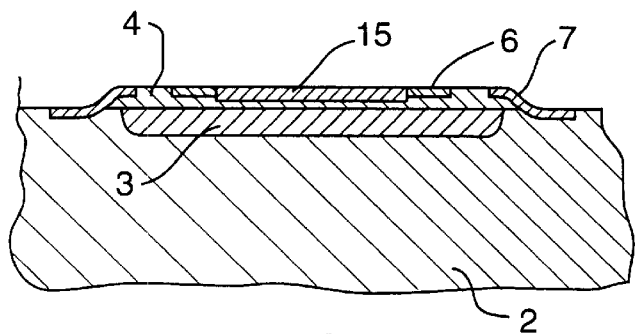
Figure 8:
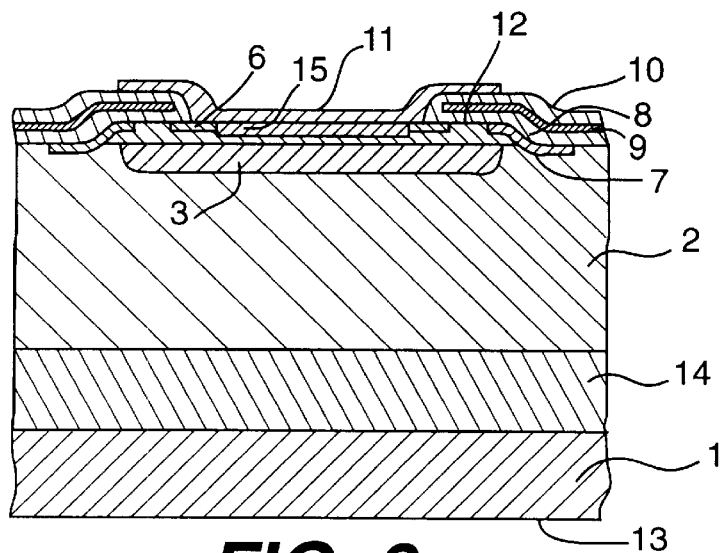

A method for producing a MISFET having a lateral conducting inversion channel will now be described with reference to FIGS. 1–4. Conventional semiconductor device producing steps having nothing to do with the invention, such as masking, demasking and so on, have for the sake of clarity not been shown in the figures. First of all a highly doped n-type substrate layer 1 and on top thereof a low doped n-type drift layer 2 are epitaxially grown (see FIG. 4). After that p-type dopants, preferably aluminium or boron, but also other dopants are conceivable, are implanted into the surface layer of the drift layer to form a highly doped p-type first base sub-layer 3. That step is followed by a step of epitaxially growing (see FIG. 2) a low doped p-type second base sub-layer 4 on top of the first base sub-layer. This epitaxial growth is preferably carried out by using the Chemical Vapor Deposition technique at a high temperature, preferably above 1500° C., and an annealing of the implanted layer 3 for making the dopants implanted electrically active may be carried out in connection therewith by raising the temperature to 1700° C. or more.

After that a MESA etch is carried out in the second base sub-layer 4 for forming a wall 5 extending to the drift layer 2. Then are n-type dopants implanted into the surface layer of the second base sub-layer 4 to form a highly doped n-type source region layer 6 and n-type dopants are implanted into the second base sub-layer 4 at a lateral distance from the source region layer and in connection with the wall and into the wall to form an additional n-type highly doped layer 7 extending from the surface of second base sub-layer 4 to the drift layer 2. This step is followed by an annealing step to making the n-type implanted dopants electrically active.

An insulating layer 8, for instance of $SiO_2$, with a gate electrode 9 thereon is applied on the second base sub-layer 4 at least from the source region layer 6 to the additional n-type layer 7. The gate electrode is preferably of polycrystalline silicon. After that a passivating additional insulating layer 10 is applied over the gate electrode and the upper surface of the device leaving an area of the source region layer 6 exposed, and a source 11 is then applied on the layer 6.

This device will function in the following way: When a voltage is applied on the gate electrode 9 a lateral conducting inversion channel is created at the interface 12 between the second base sub-layer and the insulating layer 8 between the source region layer 6 and the additional n-type layer 7, so that, provided that a voltage is applied over the source 11 and a drain 13, in the forward direction of the device an electron current will flow from the source to the drain. By making the base layer of two differently strong is doped layers in this way a high channel mobility thanks to a low threshold voltage may be combined with a high breakdown voltage in the blocking state of the device. The second base sub-layer 4 having a low doping, which typically but not always means in the range of $10^{15}$–$10^{18}$ cm$^{-3}$, next to the interface with the insulating layer 8 results in a low threshold voltage, i.e. a low voltage necessary to apply on the gate electrode for creating the inversion channel and thereby a high charge mobility in the channel. Furthermore the highly doped, which typically but not always means a doping concentration of $10^{19}$ cm$^{-3}$–$10^{21}$ cm$^{-3}$, first base sub-layer 3 thereunder next to the pn-junction to the drift layer makes it possible to apply high reverse voltages to the device without depleting the base layer and causing a breakdown of the device. This preferred structure was possible to obtain for SiC by using the technique for epitaxial regrowth after implantation.

FIGS. 5–8 illustrate the different steps for producing an IGBT (insulated gate bipolar transistor) according to a second preferred embodiment of the invention. This method comprises the same steps as the method described above with reference to FIGS. 1–4 except for the initial growth of a highly doped p-type substrate layer 1 and a highly doped n-type buffer layer 14 on top thereof, and the additional step of implanting p-type dopants into a surface layer of the second base sub-layer 4 for forming an additional highly doped p-layer 15 located laterally at the opposite side of the source region layer 6 with respect to the wall 5. The source or the cathode 11 is applied in contact also with this additional p-type layer. In this way a good contact from the source to the p-base may be obtained. Furthermore, this additional layer will collect the holes injected into the drift layer 2 from the substrate layer 1 as a consequence the electron current flowing through the inversion channel and towards the drain in an on-state of the IGBT. A MISFET could also be produced according to the steps shown in FIGS. 5–8, but then without the buffer layer and with highly doping of the substrate layer with n-type dopants.

Figure 9:
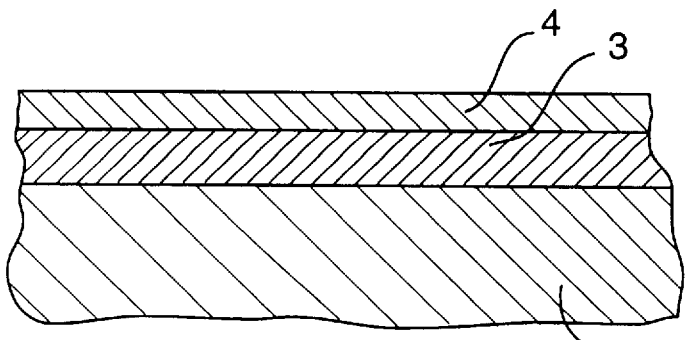
Figure 10:
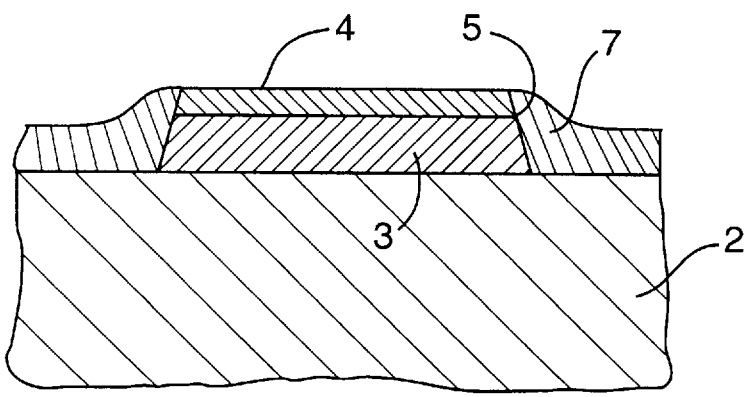
Figure 11:
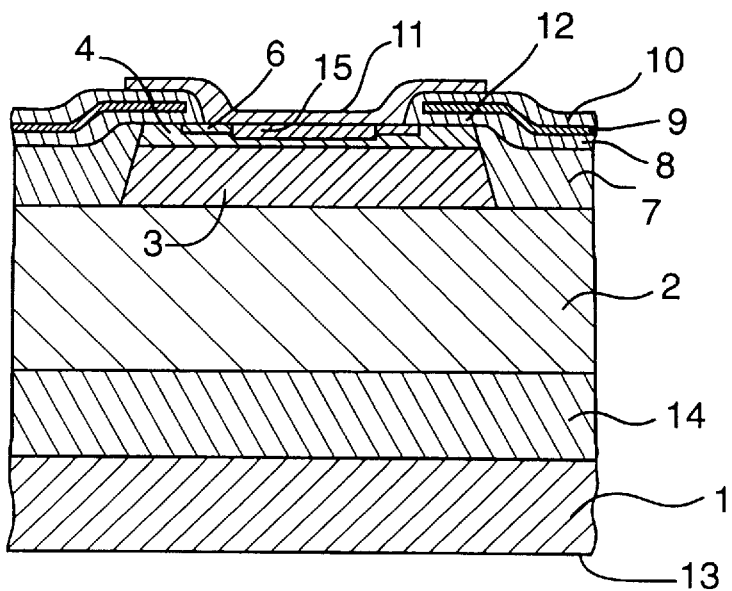

A method for producing an IGBT having a lateral conducting inversion channel according to a third preferred embodiment of the invention is illustrated in FIGS. 9–11, and this method may also be used for producing a MISFET by the same changes in process steps as just described with respect to FIGS. 5–8. First of all the following semiconductor layers of SiC are epitaxially grown on top of each other: a highly doped p-type substrate layer 1, a highly doped n-type buffer layer 15 (this layer is optional), a low doped n-type drift layer 2, a highly doped p-type first base substrate layer 3 and a low doped p-type second base sub-layer 4. By producing the highly doped p-type first base sub-layer 3 through epitaxial growth it will be possible to make it just as thick as desired depending on the magnitude of the voltage to be held by the device in the blocking state thereof.

After that a MESA-etch is carried out through the two base sub-layers to the drift layer to form a wall 5 of the two base sub-layers. An additional n-type layer 7 is then epitaxially grown on the wall and onto the drift layer 2 laterally to the base sub-layers so that this additional n-type layer will have an upper surface next to the second base sub-layer at substantially the same level as the upper surface of the second base sub-layer. This step is followed by a conventional planarization step for removing the part being grown on top of the second base sub-layer. Then n-type dopants are implanted into the surface layer of the second base sub-layer for forming a highly doped n-type source region layer 6 separated laterally from the additional n-type layer 7. P-type dopants are implanted into a surface layer of the second base sub-layer to form an additional highly doped p-type layer 15 located laterally at the opposite side of the source region layer with respect to the wall. Finally, an insulating layer 8, a gate electrode 9, an additional insulating layer 10 and a source 11 are applied in the same way as described above for the other two methods according to the invention. This device shown in FIG. 11 will have the same function as the device shown in FIG. 8, but the highly doped first base sub-layer 3 may be made thicker as a consequence of the different production steps.

The highly doped p-type additional layer 15 may be omitted when a MISFET is produced in this way.

The invention is of course not in any way restricted to the preferred embodiments described above, but many possibilities of modification thereof would be apparent to a man skilled in the art without departing from the basic idea of the invention.

It is emphasized that the thicknesses of different layers in the figures can not be interpreted as limiting the scope of protection, but any thickness relations are intended to be covered by the claims.

The dopants used may be of any material suitable as dopants for this application.

It is well possible to make the additional n-type layer forming a connection between the created inversion channel and the drift layer moderately or low doped, but the on-state losses will be reduced when it is highly doped.

The number of layers mentioned in the claims is a minimal number, and it is within the scope of the invention to arrange further layers in the device or dividing any layer into several layers by selective doping of different regions thereof.

"Substrate layer" is in this disclosure to be interpreted as the layer closest to the drain of the layers mentioned and it has not to be a substrate layer in the strict sense of this word within this field, i.e. the layer from which the growth is started. The real substrate layer may be any of the layers and is mostly the thickest one, which may be the drift layer.

The method claims are to be interpreted as not restricted to a growth of the layers located on top of each other in the order they are mentioned, but any other order of growth of these layers is within the scope of the claims. For instance, the method may be started from the drift layer and the so called substrate layer and the drain may be grown at the very end of the method.

What is claimed is:

1. A transistor of SiC comprising:

an n-type drift layer arranged on a substrate;

a p-type base layer on the drift layer;

an n-type source region formed on the base layer and having ends limited by the base layer;

an insulating layer arranged on top of the base layer and extending laterally from at least the source region to the drift layer;

a source on top of the source region;

a gate electrode on top of the insulating layer, the base layer being low doped in a second region next to the interface to the insulating layer and highly doped in a first region under the second region and next to the drift layer; and an additional n-type layer extending from a part of the second region of the base layer to the drift layer, whereby upon applying a voltage to the gate electrode a conducting inversion channel is formed extending substantially laterally in the base layer at an interface to the insulating layer for electron transport from the source to a drain and the additional n-type layer conducts electrons moving in the conducting inversion channel from the source region to the drift layer.

2. A transistor according to claim 1 wherein the substrate is p-type.

3. A transistor according to claim 2 further comprising a highly doped n-type buffer layer between the substrate and the drift layer.

4. A transistor according to claim 1 wherein the insulating layer extends laterally to the additional n-type layer.

5. A transistor according to claim 1 wherein the base layer is divided into two sub-layers, a highly doped lower first base sub-layer and a low doped upper second base sub-layer.

6. A transistor according to claim 1 wherein the source region layer is partially immersed into the base layer so that an upper surface of the source region layer is at the same level as a surface of the base layer at the interface to the insulating layer.

7. A transistor according to claim 1 further comprising an additional highly doped p-type layer on top of the base layer and arranged on the opposite side of the end portions of the source region layer with respect to the interface, the additional p-type layer being in contact with the source.

* * * * *